United States Patent

Simcock et al.

(10) Patent No.: US 9,430,590 B2
(45) Date of Patent: Aug. 30, 2016

(54) OPTICAL DESIGN TECHNIQUES FOR ENVIRONMENTALLY RESILIENT OPTICAL COMPUTING DEVICES

(71) Applicant: Halliburton Energy Services, Inc., Houston, TX (US)

(72) Inventors: Michael Neil Simcock, Columbia, SC (US); David L. Perkins, The Woodlands, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 205 days.

(21) Appl. No.: 14/232,094

(22) PCT Filed: Feb. 20, 2013

(86) PCT No.: PCT/US2013/026884
§ 371 (c)(1),
(2) Date: Jan. 10, 2014

(87) PCT Pub. No.: WO2014/130025
PCT Pub. Date: Aug. 28, 2014

(65) Prior Publication Data
US 2015/0356204 A1   Dec. 10, 2015

(51) Int. Cl.
*G06F 17/50* (2006.01)
*G02B 27/00* (2006.01)
(Continued)

(52) U.S. Cl.
CPC .............. *G06F 17/50* (2013.01); *G02B 5/285* (2013.01); *G02B 5/289* (2013.01); *G02B 7/008* (2013.01); *G02B 27/0012* (2013.01)

(58) Field of Classification Search
CPC .. G06F 17/5009; G06F 11/261; G06F 17/50; G01D 3/22; G01D 18/00; G01D 18/008; G01N 21/27; G01N 21/274

USPC ........................ 703/13; 702/104; 356/239.2
See application file for complete search history.

(56) References Cited

U.S. PATENT DOCUMENTS

| 5,212,584 A | * | 5/1993 | Chung | ..................... G02F 1/21 359/260 |
|---|---|---|---|---|
| 6,198,531 B1 | | 3/2001 | Myrick et al. | |

(Continued)

OTHER PUBLICATIONS

Soyemi et al. "Design and Testing of a multivariate Optical Element: The First Demonstration of Multivariate Optical Computing for Predictive Spectroscopy", Aanalytical Chemistry, vol. 73, No. 6, Mar. 15, 2001, pp. 1069-1079.*

(Continued)

*Primary Examiner* — Kibrom K Gebresilassie
*Assistant Examiner* — Shiuh-Huei Ku
(74) *Attorney, Agent, or Firm* — McDermott Will & Emery LLP; Benjamin Fite

(57) ABSTRACT

Disclosed are optical design techniques for generating environmentally resilient optical elements used in optical computing devices. One method for designing an integrated computational element (ICE) includes generating a plurality of theoretical ICE designs with a design suite stored on a non-transitory, computer-readable medium, each theoretical ICE design being configured to detect a characteristic of interest and comprising one or more layers, sorting the theoretical ICE designs based on performance criteria of each theoretical ICE design and thereby identifying one or more predictive ICE designs, calculating a theoretical effect of a temperature shift on each predictive ICE design, and selecting for fabrication one or more predictive ICE designs based on favorable temperature stability.

18 Claims, 2 Drawing Sheets

(51) Int. Cl.
*G02B 7/00* (2006.01)
*G02B 5/28* (2006.01)
*G01D 18/00* (2006.01)
*G01N 21/27* (2006.01)

(56) References Cited

U.S. PATENT DOCUMENTS

| | | | |
|---|---|---|---|
| 6,529,276 B1 * | 3/2003 | Myrick | G01J 3/02 |
| | | | 356/310 |
| 7,123,844 B2 | 10/2006 | Myrick | |
| 7,920,258 B2 | 4/2011 | Myrick et al. | |
| 8,352,205 B2 | 1/2013 | Myrick et al. | |
| 2009/0219512 A1 | 9/2009 | Myrick et al. | |
| 2010/0165134 A1 | 7/2010 | Dowski, Jr. et al. | |
| 2010/0201981 A1 | 8/2010 | Stanke et al. | |
| 2010/0202055 A1 | 8/2010 | Norton et al. | |

OTHER PUBLICATIONS

Frederick et al. "On-line re-optimization of filter designs for multivariate optical elements", Applied Optics, vol. 10, Apr. 1, 2003, pp. 1833-1838.*
International Search Report and Written Opinion for PCT/US2013/026884 dated Nov. 28, 2013.
Profeta et al., "Spectral Resolution in Multivariate Optical Computing," Spectrochimica Acta Part A 67, 2007, pp. 483-502.
Haibach et al., "On-Line Optimization of Filter Designs for Multivariate Optical Elements," Applied Optics, vol. 42, Issue 10, 2004, pp. 1833-1838.
Soyemi et al., "Design and Testing of a Multivariate Optical Element: The First Demonstration of Multivariate Optical Computing for Predictive Spectroscopy," Analytical Chemistry, 2001, vol. 73, No. 6, pp. 1069-1079.

* cited by examiner

OPTICAL DESIGN TECHNIQUES FOR ENVIRONMENTALLY RESILIENT OPTICAL COMPUTING DEVICES

This application is a National Stage entry of and claims priority to International Application No. PCT/US2013/026884, filed on Feb. 20, 2013.

BACKGROUND

The present invention relates to optical computing devices and, more particularly, to optical design techniques for generating environmentally resilient optical elements used in optical computing devices.

Optical computing devices, also commonly referred to as "opticoanalytical devices," can be used to analyze and monitor a substance in real time. Such optical computing devices will often employ a processing element that optically interacts with the substance to determine quantitative and/or qualitative values of one or more physical or chemical properties of the substance. The processing element may be, for example, an integrated computational element (ICE), also known as a multivariate optical element (MOE), which is essentially an optical interference filter that can be designed to operate over a continuum of wavelengths in the electromagnetic spectrum from the UV to mid-infrared (MIR) ranges, or any sub-set of that region. Electromagnetic radiation that optically interacts with the ICE is changed so as to be readable by a detector, such that an output of the detector can be correlated to the physical or chemical property of the substance being analyzed.

An ICE typically includes a plurality of optical layers consisting of various materials whose index of refraction and size (e.g., thickness) may vary between each layer. An ICE design refers to the number and thickness of the respective layers of the ICE component. The layers may be strategically deposited and sized so as to selectively pass predetermined fractions of electromagnetic radiation at different wavelengths configured to substantially mimic a regression vector corresponding to a particular physical or chemical property of interest. Accordingly, an ICE design will exhibit a transmission function that is weighted with respect to wavelength. As a result, the output light intensity from the ICE conveyed to the detector may be related to the physical or chemical property of interest for the substance.

It has been found, however, that the resulting transmission function for some ICE designs may change or shift over a range of environmental conditions. For example, an ICE employed in a downhole environment, such as is common in the oil and gas industry, might be expected to operate in temperatures ranging between 150° F. and 350° F., in pressures ranging between 3,000 psi and 20,000 psi, and at an absolute humidity reaching 15%. In such extreme environmental conditions, it is preferred that ICE components maintain a standard prediction error of less than 2% over the range of concentration of an analyte under study. Due to temperature fluctuations, however, the material refractive indices and layer thicknesses for some ICE designs may fluctuate, thereby adversely affecting the corresponding transmission function. In other cases, the effects of humidity (related to temperature and pressure) may cause a spectral shift due to interaction with surface material, thereby providing faulty or otherwise inaccurate predictions.

What is needed, therefore, are systems and methods of designing and optimizing ICE components that are robust with regards to spectral error arising from calibration errors and environmental factors that have a critical impact in, for example, oilfield applications.

SUMMARY OF THE INVENTION

The present invention relates to optical computing devices and, more particularly, to optical design techniques for generating environmentally resilient optical elements used in optical computing devices.

In some embodiments, a method for designing an integrated computational element (ICE) is disclosed. The method includes generating a plurality of theoretical ICE designs with a design suite stored on a non-transitory, computer-readable medium, each theoretical ICE design being configured to detect a characteristic of interest and comprising one or more layers, sorting the theoretical ICE designs based on performance criteria of each theoretical ICE design and thereby identifying one or more predictive ICE designs, calculating a theoretical effect of a temperature shift on each predictive ICE design, and selecting for fabrication one or more predictive ICE designs based on favorable temperature stability.

In other embodiments, a method of fabricating an integrated computational element (ICE) is disclosed. The method may include loading an ICE design into a processor configured to execute one or more programming stances provided by a fabrication computer program stored on a non-transitory, computer-readable medium, the ICE design being configured to detect a characteristic of interest and comprising a plurality of layers, calculating a theoretical effect of a temperature shift for each of the plurality of layers of the ICE design, setting a deposition of each of the plurality of layers based on a sensitivity of each layer to a corresponding standard error of calibration, and commencing fabrication of the ICE.

In yet other embodiments, a method of designing and manufacturing an integrated computational element (ICE) is disclosed. The method may include generating a plurality of theoretical ICE designs with a design suite stored on a non-transitory, computer-readable medium, each theoretical ICE design comprising a plurality of layers, sorting the theoretical ICE designs based on performance criteria of each theoretical ICE design and thereby identifying one or more predictive ICE designs, calculating a theoretical effect of a temperature shift on each predictive ICE design, selecting for fabrication at least one predictive ICE design based on favorable temperature stability, loading the at least one predictive ICE design into a processor configured to execute one or more programming stances provided by a fabrication computer program stored on a non-transitory, computer-readable medium, setting a deposition of each layer of the at least one predictive ICE based on a sensitivity of each layer to a corresponding standard error of calibration, and commencing fabrication of the ICE.

The features and advantages of the present invention will be readily apparent to those skilled in the art upon a reading of the description of the preferred embodiments that follows.

BRIEF DESCRIPTION OF THE DRAWINGS

The following figures are included to illustrate certain aspects of the present invention, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1:
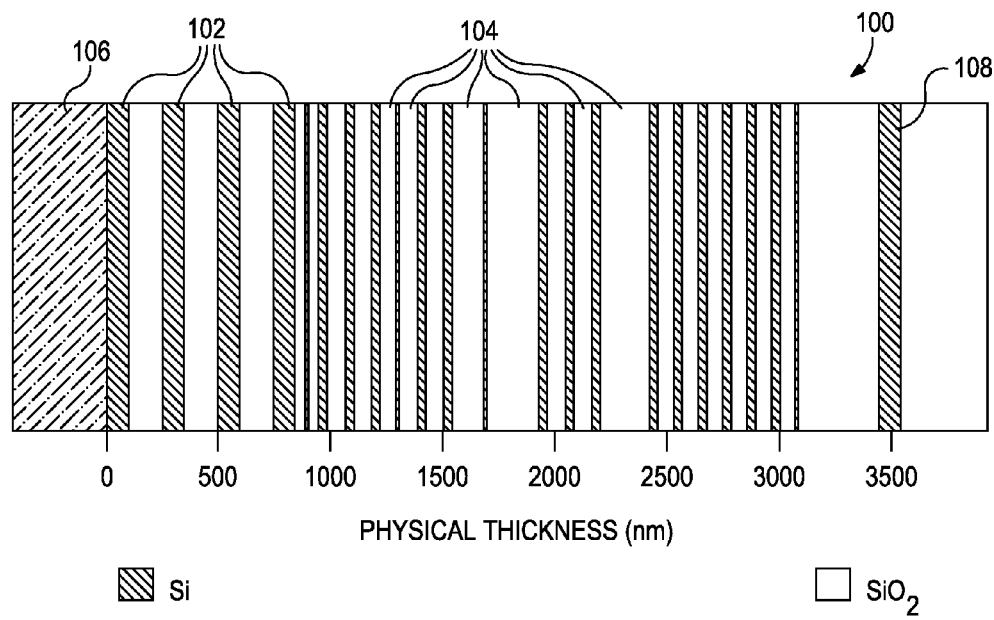
FIG. 1 illustrates an exemplary integrated computation element, according to one or more embodiments.

The present invention relates to optical computing devices and, more particularly, to optical design techniques for generating environmentally resilient optical elements used in optical computing devices.

The present disclosure facilitates the design, fabrication and delivery of more robust optical elements, such as integrated computational elements (ICE), that will suitably operate over a range of fluctuating environmental conditions. Prior methods of designing and fabricating such optical elements included sorting thousands of optical element designs based on prediction error and signal quality. The resulting fabricated ICE components were then hand-picked by an expert in the art who would select a design believed to best meet required operating criteria based on experience garnered over several years. Some of the selected ICE components, however, would not operate as intended in practice. Instead, when the ICE would encounter extreme or fluctuating environmental conditions, the resulting spectrum profile for the selected ICE component would shift, thereby returning inaccurate predictions.

The improvements described in the present disclosure include methods of performing a methodical mathematical analysis of likely effects on the physical characteristics of ICE components due to various changes in environmental conditions. Such analyses can be applied to both the design stage, where an appropriate ICE design is theorized and ultimately chosen, and during the fabrication stage to ensure that re-optimization of the design does not lead to modified designs that might become poor in terms of environmental stability. Advantageously, choosing an ICE design using the methods described herein may not require an expert in the art to examine if viable designs exist based on a set of steps and criterion. Instead, an ICE design may be intelligently selected by one that is not necessarily skilled in the art. With the help of the methods described herein, however, those skilled in the art may be able to more quickly choose the most robust ICE design with greater ease and with a success rate increasing from approximately 20% predictability to at or near 100% predictability.

The disclosed systems and methods may be suitable for designing and fabricating ICE components for use in the oil and gas industry which oftentimes deploys optical computing devices in environments exhibiting extreme conditions. It will be appreciated, however, that the various disclosed systems and methods are equally applicable to designing and fabricating ICE components for use in other technology fields including, but not limited to, the food and drug industry, industrial applications, mining industries, or any field where it may be advantageous to determine in real-time or near real-time a characteristic of a specific substance, but where the environmental factors, such as temperature, pressure, and humidity, have a critical impact in monitoring applications.

As used herein, the term "characteristic" refers to a chemical, mechanical, or physical property of a substance. A characteristic of a substance may include a quantitative or qualitative value of one or more chemical constituents or compounds present therein or any physical property associated therewith. Such chemical constituents and compounds may be referred to herein as "analytes." Illustrative characteristics of a substance that can be monitored with the optical computing devices described herein can include, for example, chemical composition (e.g., identity and concentration in total or of individual components), phase presence (e.g., gas, oil, water, etc.), impurity content, pH, alkalinity, viscosity, density, ionic strength, total dissolved solids, salt content (e.g., salinity), porosity, opacity, bacteria content, total hardness, combinations thereof, state of matter (solid, liquid, gas, emulsion, mixtures, etc), and the like.

As used herein, the term "electromagnetic radiation" refers to radio waves, microwave radiation, infrared and near-infrared radiation, visible light, ultraviolet light, X-ray radiation and gamma ray radiation.

As used herein, the term "optical computing device" refers to an optical device that is configured to receive an input of electromagnetic radiation associated with a substance and produce an output of electromagnetic radiation from a processing element arranged within the optical computing device. The processing element may be, for example, an integrated computational element (ICE), also known as a multivariate optical element (MOE). The electromagnetic radiation that optically interacts with the processing element is changed so as to be readable by a detector, such that an output of the detector can be correlated to a particular characteristic of the substance. The output of electromagnetic radiation from the processing element can be reflected, transmitted, and/or dispersed electromagnetic radiation. Whether the detector analyzes reflected, transmitted, or dispersed electromagnetic radiation may be dictated by the structural parameters of the optical computing device as well as other considerations known to those skilled in the art. In addition, emission and/or scattering of the fluid, for example via fluorescence, luminescence, Raman, Mie, and/or Raleigh scattering, can also be monitored by optical computing devices.

As used herein, the term "optically interact" or variations thereof refers to the reflection, transmission, scattering, diffraction, or absorption of electromagnetic radiation either on, through, or from one or more processing elements (i.e., ICE or MOE components) or a substance being analyzed by the processing elements. Accordingly, optically interacted light refers to electromagnetic radiation that has been reflected, transmitted, scattered, diffracted, or absorbed by, emitted, or re-radiated, for example, using a processing element, but may also apply to interaction with a substance.

As mentioned above, the processing element used in the above-defined optical computing devices may be an integrated computational element (ICE). In operation, an ICE is capable of distinguishing electromagnetic radiation related to a characteristic of interest of a substance from electromagnetic radiation related to other components of the substance. Referring to FIG. 1, illustrated is an exemplary ICE 100, according to one or more embodiments. As illustrated, the ICE 100 may include a plurality of alternating layers 102 and 104, such as silicon (Si) and $SiO_2$ (quartz), respectively. In general, these layers 102, 104 consist of materials whose index of refraction is high and low, respectively. Other examples of materials might include niobia and niobium, germanium and germania, MgF, SiO, and other high and low index materials known in the art. The layers 102, 104 may be strategically deposited on an optical substrate 106. In some embodiments, the optical substrate 106 is BK-7 optical glass. In other embodiments, the optical substrate 106 may be another type of optical substrate, such as quartz, sapphire, silicon, germanium, zinc selenide, zinc sulfide, or various plastics such as polycarbonate, polymethylmethacrylate (PMMA), polyvinylchloride (PVC), diamond, ceramics, combinations thereof, and the like.

At the opposite end (e.g., opposite the optical substrate 106 in FIG. 1), the ICE 100 may include a layer 108 that is generally exposed to the environment of the device or installation, and may be able to detect a sample substance. The number of layers 102, 104 and the thickness of each layer 102, 104 are determined from the spectral attributes acquired from a spectroscopic analysis of a characteristic of the substance being analyzed using a conventional spectroscopic instrument. The spectrum of interest of a given characteristic typically includes any number of different wavelengths. It should be understood that the exemplary ICE 100 in FIG. 1 does not in fact represent any particular characteristic of a given substance, but is provided for purposes of illustration only. Consequently, the number of layers 102, 104 and their relative thicknesses, as shown in FIG. 1, bear no correlation to any particular characteristic. Nor are the layers 102, 104 and their relative thicknesses necessarily drawn to scale, and therefore should not be considered limiting of the present disclosure. Moreover, those skilled in the art will readily recognize that the materials that make up each layer 102, 104 (i.e., Si and $SiO_2$) may vary, depending on the application, cost of materials, and/or applicability of the material to the given substance being analyzed.

In some embodiments, the material of each layer 102, 104 can be doped or two or more materials can be combined in a manner to achieve the desired optical characteristic. In addition to solids, the exemplary ICE 100 may also contain liquids and/or gases, optionally in combination with solids, in order to produce a desired optical characteristic. In the case of gases and liquids, the ICE 100 can contain a corresponding vessel (not shown), which houses the gases or liquids. Exemplary variations of the ICE 100 may also include holographic optical elements, gratings, piezoelectric, light pipe, and/or acousto-optic elements, for example, that can create transmission, reflection, and/or absorptive properties of interest.

The multiple layers 102, 104 exhibit different refractive indices. By properly selecting the materials of the layers 102, 104 and their relative thickness and spacing, the ICE 100 may be configured to selectively pass/reflect/refract predetermined fractions of electromagnetic radiation at different wavelengths. Each wavelength is given a predetermined weighting or loading factor. The thickness and spacing of the layers 102, 104 may be determined using a variety of approximation methods from the spectrum of the characteristic or analyte of interest. These methods may include inverse Fourier transform (IFT) of the optical transmission spectrum and structuring the ICE 100 as the physical representation of the IFT. The approximations convert the IFT into a structure based on known materials with constant refractive indices. Further information regarding the structures and design of exemplary ICE elements is provided in *Applied Optics*, Vol. 35, pp. 5484-5492 (1996) and Vol. 29, pp. 2876-2893 (1990), which are hereby incorporated by reference.

The weightings that the layers 102, 104 of the ICE 100 apply at each wavelength are set to the regression weightings described with respect to a known equation, or data, or spectral signature. When electromagnetic radiation interacts with a substance, unique physical and chemical information about the substance may be encoded in the electromagnetic radiation that is reflected from, transmitted through, or radiated from the substance. This information is often referred to as the spectral "fingerprint" of the substance. The ICE 100 may be configured to perform the dot product of the electromagnetic radiation received by the ICE 100 and the wavelength dependent transmission function of the ICE 100. The wavelength dependent transmission function of the ICE is dependent on the layer material refractive index, the number of layers 102, 104 and the layer thicknesses. The ICE 100 transmission function is then analogous to a desired regression vector derived from the solution to a linear multivariate problem targeting a specific component of the sample being analyzed. As a result, the output light intensity of the ICE 100 is related to the characteristic or analyte of interest.

The optical computing devices employing such an ICE may be capable of extracting the information of the spectral fingerprint of multiple characteristics or analytes within a substance and converting that information into a detectable output regarding the overall properties of the substance. That is, through suitable configurations of the optical computing devices, electromagnetic radiation associated with characteristics or analytes of interest in a substance can be separated from electromagnetic radiation associated with all other components of the substance in order to estimate the properties of the substance in real-time or near real-time. Further details regarding how the exemplary ICE 100 is able to distinguish and process electromagnetic radiation related to the characteristic or analyte of interest are described in U.S. Pat. Nos. 6,198,531; 6,529,276; and 7,920,258, incorporated herein by reference in their entirety.

Optical computing devices, however, are often used in harsh environments where environmental conditions may fluctuate between extremes. This may be especially true in the oil in gas industry, where downhole temperatures can range between about 150° F. to about 350° F., downhole pressures can range between about 3,000 psi to 20,000 psi, and the absolute humidity in such environments can reach up to about 15%. Upon experiencing such environmental fluctuations or extremes, the material refractive indices and/or layer thicknesses of ICE components may change, thereby causing a spectral shift in its transmission function. According to one or more embodiments disclosed herein, such a spectral shift may be approximated by systematically altering the design of the ICE component in terms of its layer thickness, or incrementing the refractive index such that the resulting spectral changes are similar to those expected in elevated variable temperature/pressure/humidity environments.

Figure 2:
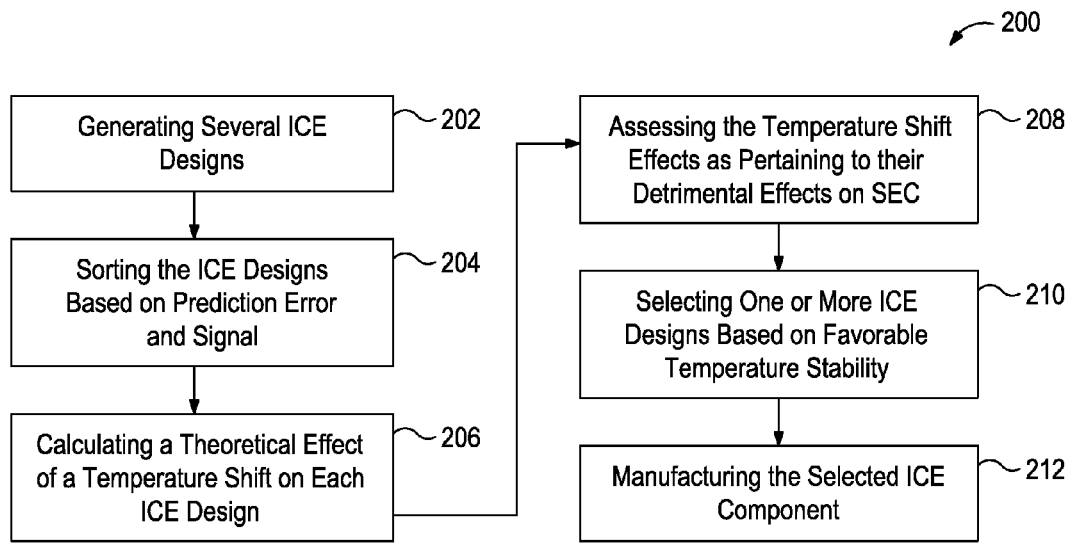
FIG. 2 illustrates a flowchart providing an exemplary method of designing an ICE component, according to one or more embodiments disclosed.

Referring to FIG. 2, illustrated is a schematic flowchart providing an exemplary method 200 of designing an ICE component, according to one or more embodiments. As illustrated, the method 200 may include generating several ICE designs, as at 202. During such a design phase, a software-based design suite or program may be employed to generate several hypothetical or theoretical ICE designs configured to detect a particular characteristic or analyte of interest. The design suite software may be stored on a computer-readable medium containing program instructions configured to be executed by one or more processors of a computer system.

In some embodiments, the design suite may commence the design process by generating a theoretical ICE component that has a random number of layers and/or a random layer thickness for each layer. The design suite may be configured to process and/or optimize the theoretical ICE component based on several "figures of merit" or performance criteria. Such performance criteria may include, but are not limited to, minimum prediction error, standard error of calibration (SEC), standard error of performance (SEP), sensitivity, slope of the calibration curve, signal-to-noise ratio, and mean transmission value corresponding to the particular characteristic or analyte of interest. During the optimization process, the design suite may be configured to vary layer thicknesses and/or remove layers until one or more preferred designs of the theoretical ICE component are created that meet one or more minimum criteria for predicting the analyte of interest. Several thousands of ICE designs may be generated from the theoretical ICE component in this stage.

The method 200 may further include sorting the theoretical ICE designs generated by the design suite based on prediction error and signal, as at 204. In some embodiments, the various ICE designs may be sorted based on their SEC as tested against a known value for the characteristic or analyte of interest. For example, the SEC for each ICE design may be calculated by taking the square root of the sum of squares between the known value for the analyte of interest and the predicted value as derived from the transmission spectrum of the particular ICE design. This is accomplished for each ICE design by calculating its respective transmission spectrum and applying that transmission spectrum to the known data set of the analyte of interest.

In some embodiments, the design suite may be configured to iterate and/or optimize layer thicknesses and numbers until reaching a reasonable SEC for one or more ICE designs. The resulting SEC for each ICE design is indicative of how good of a predictor the particular ICE component will be for the analyte of interest. In some embodiments, ICE designs exhibiting an SEC of 2.00 or less, for example, may be considered "predictive" and ICE designs exhibiting an SEC of greater than 2.00 may be considered "non-predictive." In other embodiments, the resulting SEC value that determines whether an ICE design will be considered predictive or not may be greater or less than 2.00, without departing from the scope of the disclosure. Those ICE designs that are ultimately considered non-predictive may be removed from consideration either by the operator or by software instructions carried out by the design suite.

After generating or otherwise determining one or more predictive ICE designs, the various predictive ICE designs may be tested to determine their change in performance when subjected to various changes in environmental conditions, such as temperature, pressure, and/or humidity. In at least one embodiment, for instance, the method 200 may proceed by calculating a theoretical effect of a temperature shift on each ICE design, as at 206. In some embodiments, this may be accomplished by incrementally modifying design layer thicknesses and/or refractive index changes over a range of theoretical temperatures corresponding to that which is expected to be experienced in the operational application (e.g., downhole).

One way to determine or otherwise calculate the theoretical effect of a temperature shift on a particular ICE design is to determine the SEC of the ICE design upon experiencing a theoretical thermal expansion or contraction. For instance, the materials that make up the several layers of an ICE will naturally expand or contract upon experiencing or otherwise encountering increased or decreased temperatures, respectively. Accordingly, a theoretical temperature shift may be determined by treating the temperature effect as an expansion or contraction on each layer of the ICE design. For instance, in the case of increased temperatures, each layer of the ICE design may be expected to grow (i.e., expand) by X %, or 2X %, or 3X %, etc. Alternatively, in the case of decreased temperatures, each layer of the ICE design may be expected to shrink (i.e., contract) by X %, or 2X %, or 3X %, etc. After calculating the theoretical effect of expansion or contraction of the ICE design (i.e., X %, 2X %, 3X %), a new SEC calculation for the ICE design may be determined and compared against the original SEC of the particular ICE design, thereby determining which ICE design is more or less susceptible to error magnification upon being exposed to temperature shifts.

Referring to Table 1 below, depicted is an example of how a particular ICE design may perform when exposed to increased and decreased theoretical temperature shifts. The exemplary ICE design ("Original") includes thirteen layers, each layer potentially being made of different materials and having different corresponding thicknesses (measured in nanometers (nm)). In the middle column, each layer of the original ICE design was used to calculate a transmission spectrum for the ICE component, and a resulting standard error of calibration (SEC) of 0.446 was derived therefrom.

TABLE 1

| Layer # | Layer Thickness (nm) | | |
|---|---|---|---|
| | −0.2% | Original | +0.2% |
| 1 | 286.84 | 287.42 | 287.99 |
| 2 | 618.64 | 619.88 | 621.12 |
| 3 | 512.75 | 513.77 | 514.8 |
| 4 | 20.54 | 20.58 | 20.62 |
| 5 | 58.41 | 58.53 | 58.64 |
| 6 | 257.33 | 275.84 | 258.36 |
| 7 | 243.49 | 243.98 | 244.46 |
| 8 | 483.25 | 484.22 | 485.19 |
| 9 | 643.99 | 645.28 | 646.57 |
| 10 | 272.08 | 272.62 | 273.17 |
| 11 | 386.63 | 387.4 | 388.18 |
| 12 | 141.11 | 141.39 | 141.67 |
| 13 | 175.48 | 175.83 | 176.18 |
| SEC | 2.089 | 0.446 | 2.246 |

To determine or otherwise calculate the theoretical effect of a temperature shift as experienced by the ICE design, a temperature variation (e.g., 50° C.) was modeled as a change in the physical thickness of each layer due to expansion (+0.2%) or contraction (−0.2%). By altering the physical thickness of each layer, a new transmission spectrum may be obtained corresponding to a uniform expansion (+0.2%) or contraction (−0.2%) of the original ICE design. From the new transmission spectra, a new SEC may be determined for the each of the expanded and contracted designs. As illustrated, the SEC for the expanded and contracted designs increases to 2.246 and 2.089, respectively. In other words, if each layer of the ICE design expands or contracts by 0.2%, the resulting SEC for the particular design will increase by as much as a factor of 5, thereby equating to a performance decrease of the same magnitude.

Figure 3:
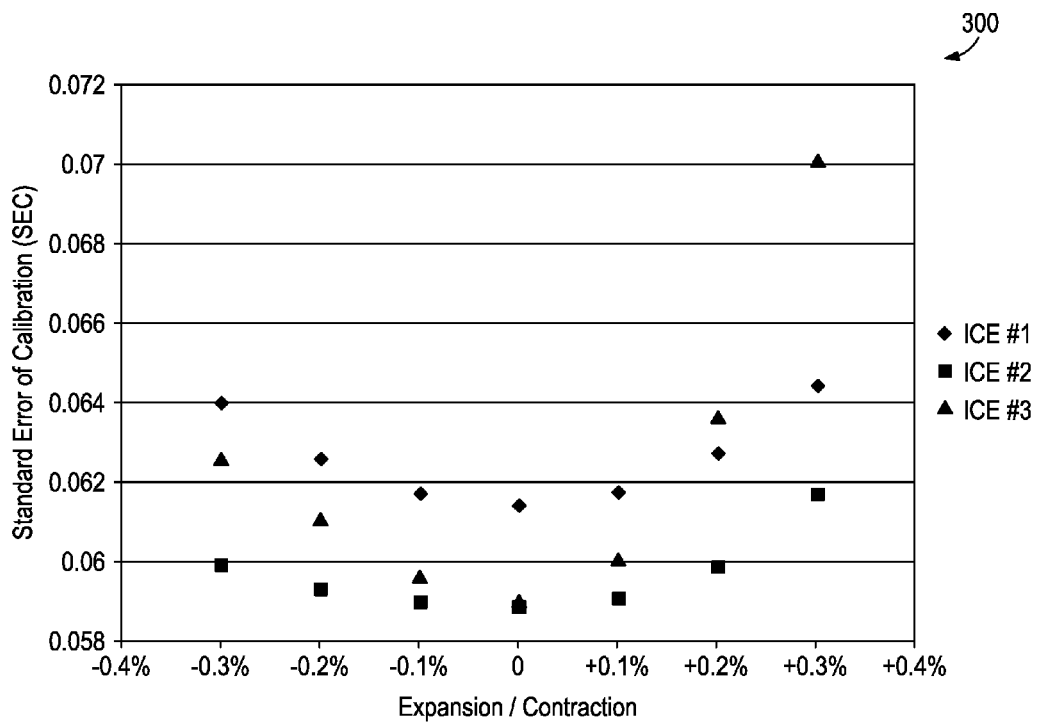
FIG. 3 illustrates a plot that demonstrates the theoretical effect of temperature shifts on three exemplary integrated computational element designs, according to one or more embodiments.

Referring to FIG. 3, illustrated is a plot 300 that demonstrates the theoretical effect of temperature shifts on three exemplary ICE designs, according to one or more embodiments. The plot 300 may be generated, for example, using a software program stored on a computer-readable medium containing program instructions configured to be executed by one or more processors of a computer system and configured to hypothetically expand or contract the thickness of the ICE design and provide an output in the form of the plot 300 for consideration. Specifically, the plot 300 may provide an exemplary estimation of the expected detriment to three ICE designs, measured in terms of SEC along the y-axis, due to one or more theoretical thermal shifts experienced by three ICE designs. If the temperature fluctuates by a predetermined amount, such as 50° C., each layer of the three ICE designs can be expected to expand/contract by a corresponding percentage value, as indicated along the x-axis. Percentage values to the left of the original design point "0" are indicative of corresponding contractions in the thickness of each layer which can be expected upon experiencing decreased temperatures. Percentage values to the right of the original design point "0" are indicative of corresponding expansions in the thickness of each layer which can be expected upon experiencing increased temperatures.

As illustrated in the plot 300, at the central point "0" the first ICE design ("ICE #1") exhibits an SEC value of about 0.0618, the second ICE design ("ICE #2") exhibits an SEC value of about 0.059, and the third ICE design ("ICE #3") exhibits an SEC value of about 0.0591. Accordingly, ICE #2 and ICE #3 may be considered more predictive of the particular analyte of interest than ICE #1 when operating at their designed temperatures. However, upon theoretically heating or cooling each ICE design to a temperature that will affect the thickness of the layers by the stated percentage value (x-axis), a new transmission spectrum signal can be measured or otherwise obtained for each ICE design at that particular point. With a new transmission spectrum, a new SEC value may be then calculated for each ICE design, as indicated by the various points in the plot 300. In other words, each new transmission spectrum corresponds to a new predictive SEC for each ICE design. Accordingly, the effect that temperature will have on each of the three ICE designs can be modeled and subsequently compared for predictive accuracy.

As illustrated, ICE #2 shows the best overall predictability among the three designs. ICE #3 shows a similar predictability to ICE #2 at the central point but deviates quite dramatically at either end. ICE #1 exhibits the worst average predictability among the three designs, although it exhibits a similar SEC deviation to ICE #2. Accordingly, ICE #1 and ICE #2 may be considered more predictive or otherwise more robust than ICE #3 at nominal or small temperature shifts since their corresponding SEC values are generally lower. For some applications, ICE #1 may be a reasonable design candidate since its predictability is reasonably symmetric or straight about the original design point, meaning that its error fluctuation, on average, may be less than other designs.

As will be appreciated by those skilled in the art, similar evaluations of potentially predictive ICE designs may also be done by incrementing expected refractive index influence as used to calculate the expected transmission profiles over a predetermined temperature range. This may prove advantageous since the refractive index effect is generally much larger than the expansion/contraction effect on ICE. Such evaluations may be accomplished by incrementing the refractive index of a particular ICE design based on a known (e.g., measured) dn/dT effect for the various layers of the ICE design; where n=index of refraction and T=temperature. The process thus includes multiplying the temperature change and then calculating the new "n" for each ICE design. By incrementing "n", the material for each layer of the ICE design becomes optically more/less dense, thereby affecting the resulting transmission spectrum. With a new transmission spectrum, a new SEC value may be then calculated for each ICE design, and may be displayed for consideration on, for example, a plot such as the plot 300.

The effect of these expected spectral shifts on the ICE designs due to changes in dn/dT can be averaged or otherwise processed as an alternate quality criterion other than the SEC, which is traditionally used in ICE design. This may require much more effort, however, to accurately measure the refractive index of the materials over the predetermined temperature range.

Referring again to FIG. 2, once the theoretical effect of a temperature shift on the ICE designs is obtained, as at 206, the method 200 may proceed to assessing the temperature shift effects as pertaining to their detrimental effects on SEC, as at 208. In some embodiments, this may entail analyzing or otherwise considering the results depicted in the plot 300 of FIG. 3, or the like, thereby assessing the chemometric predictability of each of the tested ICE designs. Considering the standard deviations and means of each trace provided by the corresponding points of each ICE design in the plot 300, an operator (or software instructions carried out by the design suite) may be able to rapidly rank and select appropriate ICE design candidates for suitably detecting the analyte of interest. As will be appreciated, the actual traces themselves allow for a final selection of the most tolerant ICE designs. ICE designs that are evaluated to have poor temperature performance or behaviors, as indicated in the plot 300, may be removed from consideration.

The method 200 may then include selecting one or more ICE designs based on favorable temperature stability, as at 210. In other words, from the several ICE designs that were assessed to exhibit little or no detrimental impact on their chemometric predictability (i.e., SEC) when exposed to increased or decreased temperatures, one or more of the more tolerant ICE designs may be selected by the operator and listed or otherwise compiled for physical fabrication. In other embodiments, one or more of the more tolerant ICE designs may be automatically selected by a computer system or program, such as the design suite, based on predetermined thresholds that may be met by the tolerant ICE design(s). Once the preferred ICE component is selected by the operator or computer system/program, the method 200 may then proceed to manufacturing the selected ICE component, as at 212.

Figure 4:
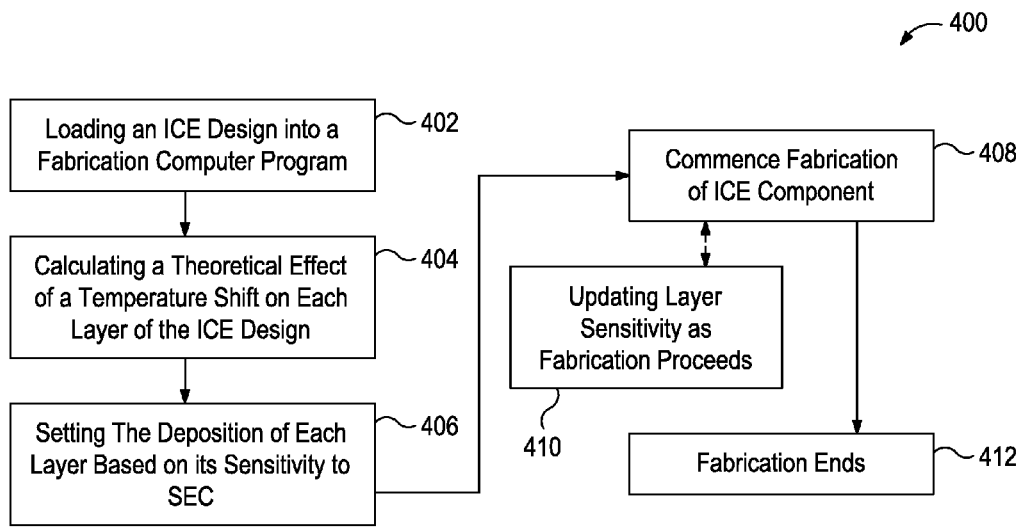
FIG. 4 illustrates is a flowchart providing an exemplary method of fabricating an ICE component, according to one or more embodiments.

Referring now to FIG. 4, illustrated is a schematic flowchart providing an exemplary method 400 of fabricating an ICE component, according to one or more embodiments. As illustrated, the method 400 may include loading an ICE design into a fabrication computer program, as at 402. In other words, the design(s) of the ICE component that was ultimately selected by the operator or computer system/program, as at 210 in FIG. 2, may be loaded into a software-based fabrication computer program configured to initiate or otherwise carry out the physical fabrication of the ICE for the detection of a particular characteristic or analyte of interest.

Similar to the design suite, discussed above, the fabrication computer program software may be stored on a computer-readable medium containing program instructions configured to be executed by one or more processors of a computer system. The fabrication computer program may be configured to receive or otherwise download the specifications for a selected ICE design as generated by the design suite and physically create a corresponding ICE component by methodically depositing the layers of the ICE component to the specified thicknesses. In some embodiments, the fabrication computer program may also contain some of the same code used by the design suite such that it may be able to measure and report transmission spectrum signals of the deposited layers and optimize layer thicknesses of the remaining layers not yet deposited in order to compensate for any fabrication errors.

In some embodiments, the method 400 may include calculating a theoretical effect of a temperature shift for each layer of the ICE design, as at 404. As will be appreciated, this step may equally be performed in the design phase of FIG. 2, without departing from the scope of the disclosure. As discussed above, ICE components can be expected to be affected by variations in temperature, and such temperature variations may be appropriately modeled as a change in the physical thickness of each layer of the ICE component due to thermal expansion or contraction. In exemplary operation, the transmission spectrum for individual layers may be measured and subsequently compared against a theoretical transmission spectrum of the corresponding layer as the ICE design is affected by a theoretical temperature shift. Resulting SEC comparisons may provide an operator with valuable information as to which layers are more or less sensitive to thermal shifts.

Referring to Table 2 below, for example, depicted is how a theoretical temperature shift for a single layer of a particular ICE design may affect the performance of the ICE design as a whole. Table 2 is similar to Table 1 in that the exemplary Original ICE design includes thirteen layers, each layer potentially being made of different materials and having different thicknesses. Again, each layer of the original ICE design in the center column may be used to calculate a transmission spectrum which results in an SEC of 0.446.

TABLE 2

| Layer # | Layer Thickness (nm) | | |
|---|---|---|---|
| | −0.2% | Original | +0.2% |
| 1 | 287.72 | 287.72 | 287.72 |
| 2 | 619.88 | 619.88 | 619.88 |
| 3 | 513.77 | 513.77 | 513.77 |
| 4 | 20.58 | 20.58 | 20.58 |
| 5 | 58.41 | 58.53 | 58.64 |
| 6 | 275.84 | 275.84 | 275.84 |
| 7 | 243.98 | 243.98 | 243.98 |
| 8 | 484.22 | 484.22 | 484.22 |
| 9 | 645.28 | 645.28 | 645.28 |
| 10 | 272.62 | 272.62 | 272.62 |
| 11 | 387.4 | 387.4 | 387.4 |
| 12 | 141.39 | 141.39 | 141.39 |
| 13 | 175.83 | 175.83 | 175.83 |
| SEC | 0.485 | 0.446 | 0.513 |

In Table 2, however, layer #5 is the only layer that has been subjected to increased and decreased theoretical temperature shifts, while the thickness of the remaining layers remains unchanged or otherwise non-affected by the temperature shift. Specifically, layer #5 was subjected to a theoretical temperature variation (e.g., 50° C.) and modeled as a change in the physical thickness thereof due to expansion (+0.2%) or contraction (−0.2%). As illustrated, the thickness of layer #5 expanded to 58.64 nm upon being subjected to increased temperatures and contracted to 58.41 nm upon being subjected to decreased temperatures. With the layer thickness change, new transmission spectra and new corresponding SEC values may be determined for each of the expanded and contracted designs. As illustrated, the resulting effect of thermal contraction and expansion of layer #5 resulted in an SEC of 0.485 and 0.513 for the original ICE design as a whole. In other words, if layer #5 expands or contracts by 0.2%, the resulting SEC for the particular design will increase accordingly, thereby equating to a performance decrease of the same magnitude.

In contrast, Table 3 below depicts how a theoretical temperature shift for another individual layer of the Original ICE design may affect the performance of the ICE design as a whole. Specifically, Table 3 illustrates the effect that thermal expansion and contraction on only layer #12 will have on the ICE design as a whole.

TABLE 3

| Layer # | Layer Thickness (nm) | | |
|---|---|---|---|
| | −0.2% | Original | +0.2% |
| 1 | 287.72 | 287.72 | 287.72 |
| 2 | 619.88 | 619.88 | 619.88 |
| 3 | 513.77 | 513.77 | 513.77 |
| 4 | 20.58 | 20.58 | 20.58 |
| 5 | 58.53 | 58.53 | 58.53 |
| 6 | 275.84 | 275.84 | 275.84 |
| 7 | 243.98 | 243.98 | 243.98 |
| 8 | 484.22 | 484.22 | 484.22 |
| 9 | 645.28 | 645.28 | 645.28 |
| 10 | 272.62 | 272.62 | 272.62 |
| 11 | 387.4 | 387.4 | 387.4 |
| 12 | 141.11 | 141.39 | 141.67 |
| 13 | 175.83 | 175.83 | 175.83 |
| SEC | 0.785 | 0.446 | 0.623 |

Layer #12 was subjected to a theoretical temperature variation (e.g., 50° C.) and modeled as a change in the physical thickness thereof due to expansion (+0.2%) or contraction (−0.2%). As illustrated, the thickness of layer #12 expanded to 141.67 nm upon being subjected to increased temperatures and contracted to 141.11 nm upon being subjected to decreased temperatures. With the layer thickness change, new transmission spectra and corresponding SEC values may be determined for each of the expanded and contracted designs. As illustrated, the resulting effect of thermal contraction and expansion of layer #12 by 0.2% results in an increased SEC of 0.785 and 0.623 for the original ICE design as a whole, thereby equating to a performance decrease of the same magnitude.

The differences in reported SEC values between Table 2 and Table 3 informs an operator that layer #12 is likely more sensitive to thermal shifts than layer #5. As a result, the operator may take additional care in fabricating layer #12 as opposed to layer #5 since any inconsistencies or errors in layer #12 may be magnified in the resulting SEC more apparently than inconsistencies or errors in fabricating layer #5. Those skilled in the art will readily appreciate that similar tests and calculations can be done for each individual layer in the ICE design, thereby providing the operator with valuable information regarding which layers of the ICE design are more susceptible to thermal shifts or otherwise more prone to degrade overall SEC values.

In some embodiments, for example, the additional care undertaken by the operator may include slowing the deposition rate of more sensitive layers and thereby ensuring accurate and precise deposition of such layers during the fabrication process. In other embodiments, or otherwise in addition thereto, the additional care undertaken by the operator may include programming or otherwise undertaking various optical measurements (e.g., analyzing the transmission profile) of more sensitive layers during the fabrication process of such sensitive layers to ensure that the deposition thickness does not overshoot or otherwise undershoot the original design parameters for the desired ICE design. For instance, optical measurements may be taken at predetermined deposited thicknesses of the sensitive layers, such as by taking optical measurements at 50%, 60%, 70%, 80%, 90%, 95%, etc. of the total layer deposition. Those skilled in the art will readily recognize that the optical measurements may be taken at other percentages of the total layer deposition, without departing from the scope of the disclosure. In other words, additional precision, accuracy, or focus on the part of the operator may be necessary or otherwise recommended in setting the layers that are more susceptible to causing SEC degradation.

The method 400 may further include setting the deposition of each layer based on the sensitivity of each layer to the SEC, as at 406. In other words, the preferred design and thickness of each individual layer of the ICE design is set depending on how sensitive each layer is to causing errors in the chemometric predictability (i.e., SEC). Sensitivity for each layer may be determined, for example, by referencing and comparing the SEC changes reported in Tables 2 and 3. Since it is now known which of the layers will be more susceptible to thermal changes than others, the care with which each layer is deposited is set depending on the effect that a particular layer may have on the final chemometric predictability. In some embodiments, for example, the deposition of each layer may be set by slowing the deposition rate of a more sensitive layer, thereby ensuring accurate and precise deposition of that layer during fabrication. In other embodiments, the deposition of each layer may be set by programming or otherwise undertaking various optical measurements during the fabrication process of the more sensitive layer to ensure that the deposition thickness does not overshoot or undershoot the preferred SEC for the ICE design as a whole. For instance, optical measurements may be taken at predetermined deposited thicknesses of the sensitive layer, such as taking optical measurements at 50%, 60%, 70%, etc. of the total layer deposition. In other words, additional precision, accuracy, or focus on the part of the operator may be necessary or otherwise recommended in setting the layers that are more susceptible to thermal changes.

Once the deposition of each layer of the ICE design is properly set, as at 406, fabrication of the ICE component may commence, as at 408. In some embodiments, the method 400 may further include updating the layer sensitivity as the fabrication process proceeds, as at 410. During the fabrication process, individual layers, especially layers determined to be more susceptible to thermal changes than others, may be optically tested in real time, as briefly mentioned above. Depending on the resulting transmission spectrum of each layer, and its potential effect on the overall SEC of the ICE component, the ICE design may be altered or otherwise re-optimized at this point. In some embodiments, for example, any errors or inconsistencies noted by the various optical measurements taken during fabrication may be reversed or otherwise remedied by altering the setting process of the remaining layers yet to be deposited. Once all layers of the ICE component have been properly set, the fabrication process can end, as at 412.

The embodiments disclosed herein may advantageously result in ICE components that may suitably operate over extended ranges of environmental conditions (i.e., temperature, pressure, humidity, etc.) than what was previously realized. This allows for more robust ICE components in terms of performance, and fewer required ICE components. This leads to simpler optical computing device designs that incorporate ICE components. In optical computing devices configured to monitor multiple analytes, spaces that would otherwise be needed for multiple ICE components configured to work over limited ranges may be replaced with optimized ICE components that are able to operate over extended ranges. As a result, more analyte measurements may be realized with the same instrument, which may advantageously eliminate multiple tools or multiple trips to complete the same job.

Those skilled in the art will readily appreciated that the methods described herein, or large portions thereof, may be automated at some point such that a computerized system may be programmed to design, predict, and fabricate ICE components that are more robust for fluctuating extreme environments. Computer hardware used to implement the various methods and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), electrically erasable programmable read only memory (EEPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

The invention claimed is:

1. A method for designing an integrated computational element (ICE), comprising:
    generating a plurality of ICE designs with a design suite stored on a non-transitory, computer-readable medium, each ICE design having at least one of a random number of layers and a random thickness for each layer;
    optimizing the plurality of ICE designs based on performance criteria and thereby generating a plurality of theoretical ICE designs configured to detect a characteristic of interest;
    sorting the theoretical ICE designs based on the performance criteria in view of a known value for the characteristic of interest and thereby identifying one or more predictive ICE designs;
    approximating a spectral shift on each predictive ICE design resulting from an expected temperature shift, wherein approximating the spectral shift includes calculating a theoretical effect of the expected temperature shift on each individual layer of each predictive ICE design;
    altering a design of the one or more predictive ICE designs based on the calculated theoretical effect of the expected temperature shift; and
    selecting for fabrication one or more predictive ICE designs based on favorable temperature stability in view of the calculated theoretical effect of the expected temperature shift.

2. The method of claim 1, wherein the performance criteria are selected from group consisting of minimum prediction error, standard error of calibration, standard error of prediction, sensitivity, slope of a calibration curve, signal-to-noise ratio, and mean transmission value as tested against a known value for the characteristic of interest.

3. The method of claim 1, further comprising removing theoretical ICE designs from consideration based on poor performance criteria.

4. The method of claim 1, wherein altering the design of the one or more predictive ICE designs comprises:
    incrementally modifying a thickness of the one or more layers over a range of theoretical temperatures; and
    determining a standard error of calibration for each predictive ICE design upon being exposed to the range of theoretical temperatures.

5. The method of claim 1, wherein altering the design of the one or more predictive ICE designs comprises:
    incrementally modifying a refractive index for the one or more layers over a range of theoretical temperatures; and
    determining a standard error of calibration for each predictive ICE design upon being exposed to the range of theoretical temperatures.

6. The method of claim 1, wherein selecting one or more predictive ICE designs comprises assessing the theoretical effect of the expected temperature shift as pertaining to its detrimental effect on a standard error of calibration for each predictive ICE design.

7. A method of fabricating an integrated computational element (ICE), comprising:
    loading an ICE design into a processor configured to execute one or more programming stances provided by a fabrication computer program stored on a non-transitory, computer-readable medium, the ICE design being configured to detect a characteristic of interest and comprising a plurality of layers;
    approximating a spectral shift on the ICE design resulting from an expected temperature shift, wherein approximating the spectral shift includes calculating a theoretical effect of the expected temperature shift for at least one layer of the ICE design;
    setting a deposition configuration for the at least one layer based on a sensitivity of the at least one layer to a corresponding standard error of calibration; and
    commencing fabrication of the ICE.

8. The method of claim 7, wherein approximating the spectral shift on the ICE design resulting from the expected temperature shift comprises:
    incrementally modifying a thickness of each of the plurality of layers over a range of theoretical temperatures; and
    determining the standard error of calibration for each of the plurality of layers upon being exposed to the theoretical temperatures.

9. The method of claim 7, wherein approximating the spectral shift on the ICE design resulting from the expected temperature shift comprises:
    incrementally modifying a refractive index for each of the plurality of layers over a range of theoretical temperatures; and
    determining the standard error of calibration for each of the plurality of layers upon being exposed to the theoretical temperatures.

10. The method of claim 7, further comprising updating the sensitivity of each layer as fabrication proceeds.

11. The method of claim 10, further comprising:
    testing one or more of the plurality of layers in real time to obtain a resulting transmission spectrum of the one or more of the plurality of layers; and re-optimizing the ICE design based on the resulting transmission spectrum of the layers tested.

12. A method of designing and manufacturing an integrated computational element (ICE), comprising:
generating a plurality of ICE designs with a design suite stored on a non-transitory, computer-readable medium, each ICE design comprising at least one of a random number of layers and a random thickness for each layer;
optimizing the plurality of ICE designs based on performance criteria and thereby generating a plurality of theoretical ICE designs configured to detect a characteristic of interest;
sorting the theoretical ICE designs based on the performance criteria in view of a known value for the characteristic of interest and thereby identifying one or more predictive ICE designs;
approximating a spectral shift on each predictive ICE design resulting from an expected temperature shift, wherein approximating the spectral shift includes calculating a theoretical effect of the expected temperature shift on each individual layer of each predictive ICE design;
selecting for fabrication at least one predictive ICE design based on favorable temperature stability in view of the calculated theoretical effect of the expected temperature shift;
loading the at least one predictive ICE design into a processor configured to execute one or more programming stances provided by a fabrication computer program stored on a non-transitory, computer-readable medium;
setting a deposition configuration for each layer of the at least one predictive ICE based on a sensitivity of each layer to a corresponding standard error of calibration; and
commencing fabrication of the ICE.

13. The method of claim 12, wherein the performance criteria are selected from group consisting of minimum prediction error, standard error of calibration, standard error of prediction, sensitivity, slope of a calibration curve, signal-to-noise ratio, and mean transmission value as tested against a known value for the characteristic of interest.

14. The method of claim 12, wherein sorting the theoretical ICE designs based on performance criteria further comprises removing theoretical ICE designs from consideration based on poor performance criteria.

15. The method of claim 12, wherein approximating a spectral shift on the ICE design resulting from the expected temperature shift comprises:
incrementally modifying a thickness of one or more of the plurality of layers over a range of theoretical temperatures; and
determining a standard error of calibration for each predictive ICE design upon as exposed to the theoretical temperatures.

16. The method of claim 12, wherein approximating a spectral shift on the ICE design resulting from the expected temperature shift comprises:
incrementally modifying a refractive index for one or more of the plurality of layers over a range of theoretical temperatures; and
determining a standard error of calibration for each predictive ICE design upon as exposed to the theoretical temperatures.

17. The method of claim 12, further comprising updating the sensitivity of each layer as fabrication proceeds.

18. The method of claim 17, further comprising:
testing one or more of the plurality of layers in real time to obtain a resulting transmission spectrum of each layer; and
re-optimizing the ICE design based on the resulting transmission spectrum of each layer.

* * * * *